Nov. 11, 1958 E. C. KARNAVAS 2,860,291

JUNCTION TYPE TRANSISTOR STRUCTURE

Filed Sept. 3, 1953

INVENTOR.
Esidoros C. Karnavas
BY
Stevens, Davis, Miller & Mosher
ATTORNEYS

United States Patent Office 2,860,291

Patented Nov. 11, 1958

2,860,291

JUNCTION TYPE TRANSISTOR STRUCTURE

Esidoros C. Karnavas, Dallas, Tex., assignor to Texas Instruments Incorporated, Dallas, Tex., a corporation of Delaware Application September 3, 1953, Serial No. 378,331

19 Claims. (Cl. 317—235)

This invention relates to junction type transistor devices and particularly to a structure suitable for simplified and uniform assembly and trouble-free, long life operation.

The theory of a transistor made from a single piece of germanium in which the conductivity type varies in such a way as to produce two rectifying junctions was first disclosed by Shockley in the Bell System Technical Journal, volume XXVIII, in 1949 and in a subsequent publication entitled "Electrons and Holes in Semiconductors" which was published by Van Nostrand in 1950. Since that time, the theory and practical utilization of transistors have been the subject of such intensive research and development that at present, the two types of transistors, the point contact and the junction type, are a practical reality.

One of the chief methods of producing junction type transistors is by the grown junction method. Assuming that it is desired to produce an n-p-n junction transistor by the grown junction method, the process originates by introducing a seed crystal into a crucible of molten germanium containing an n-type impurity in the approximate ratio of one part in one million. The seed crystal in the first instance is taken from a single crystal of germanium so that the seed itself has a single crystalline structure. The advantage to be gained in using a seed crystal is that as the seed is withdrawn from the molten germanium at a carefully controlled rate, the germanium solidifies onto the seed crystal and takes the crystalline structure of the seed. After a predetermined length of n-type germanium crystal has been grown onto the seed crystal, the impurity type concentration of the germanium in the crucible is changed from n-type to p-type by the addition of a suitable p-type impurity. This is accomplished by dropping a pellet having a relatively high intermediate concentration of p-type impurity into the molten germanium which produces the correct impurity ratio with the larger mass of germanium in the crucible. After a p-type layer of approximately 0.001 of an inch in thickness has been grown, a pellet with an intermediate concentration of n-type impurity is dropped into the germanium and the impurity concentration changed from the p-type back to the n-type impurity. The various elements capable of producing one or the other of the two types of impurity are well known in the transistor art as well as the manner in which current is conducted in either type. Upon completion of the grown junction crystal into alternate layers of n-type and p-type germanium, the crystal is sliced to sections which contain a p-type germanium layer sandwiched in between two layers of n-type germanium. These sections are then sawed into n-p-n junctions of any desired size though the usual junction crystal size is approximately ⅛" long and 1/32" square. It is contemplated that the n-p-n junction of the present invention be produced by the grown junction method, although any other method the practice of which produces the desired n-p-n junction can be employed.

In a typical circuit in which the junction type transistor is used as an amplifier, three electrodes called the emitter, collector, and base electrodes are attached to the n-p-n junction. The emitter electrode is attached to the end surface of one n-type section, the collector electrode is attached to the end surface of the other n-type section and the base electrode is attached to the p-layer of the junction. A small battery is connected between the base and emitter electrodes to bias the n-p junction in the forward direction and thereby inject electrons into the n-type layer. A larger battery is connected between the collector and base electrodes and is connected to bias the n-p junction in the reverse direction. In this circuit, the negative terminal of the small battery is connected to the emitter electrode and the positive terminal of the large battery is connected to the collector electrode. Thus, electrons are injected into the n-p junction by the negative voltage at the emitter elecrode and those that do not recombine with the holes in the p-layer pass on through and are attracted by the positive voltage at the collector electrode. Since the current loss in the p-layer is very small due to the thinness of the layer, the collector current will always be approximately equal in magnitude to the emitter current and can be controlled by varying the emitter current. However, it has been shown for such a circuit, that if the collector current is held constant, very small changes in emitter voltage will produce relatively enormous changes in collector voltage. This makes the n-p-n junction transistor suitable for many uses such as a D. C. amplifier between a low impedance source and a high impedance load.

The common practice in attaching the emitter and collector electrodes to the junction type transistor is to attach the electrodes with their lengths at right angles to the end surfaces of the two n-type layers; or in other words, the diameter of the electrode wire is in contact with the end surface of the layer. Because of the difficulty of soldering the electrodes at right angles to the respective n-type surfaces in addition to the problem of securing an adequate bond, an expedient such as spiraling the end of the wire has been used. This method, or some other method similar to this, presents a greater area for bonding the electrode to the end surface of the junction but complicates the assembly and manufacture of the transistors. Further, after the electrodes have been attached to the junction, the completed assembly has been encased in plastic to prevent the entrance of moisture which affects the operating characteristics and life of the transistor. However, the materials used for this purpose have not been completely effective and satisfactory to prevent the entrance of moisture.

Accordingly, it is an object of this invention to provide a junction type transistor structure that is more suitable for simplified and uniform assembly than structures heretofore known.

It is another object of this invention to support the junction type transistor in a structure that can be sealed to provide a positive barrier against the entrance of moisture.

Other and further objects of the present invention will become apparent from the following description when taken in conjunction with the drawings in which.

Figure 1:
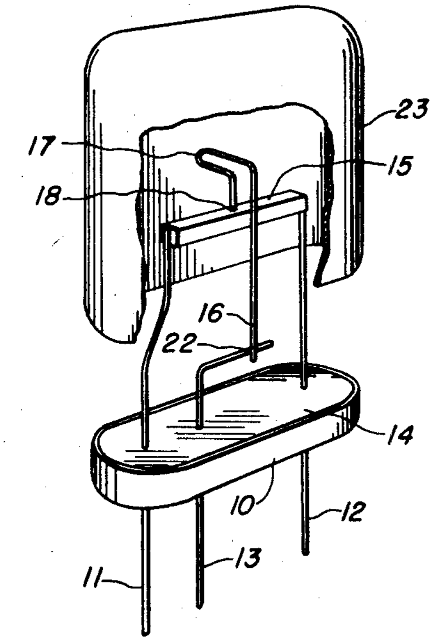
Figure 1 is a view in perspective illustrating the preferred embodiment of the invention with the transistor cover removed and partially cut away.

Referring now to the drawings, Figure 1 shows the preferred arrangement of the transistor components. The basic support structure of the transistor is composed of a header consisting of a metal band 10 and insulating material 14 and wires 11, 12 and 13. The header is oblong in shape with semi-circular ends. On the under side of the header, the metal band 10 is extended inwardly to form a shelf support for the insulating material contained within the band 10. The insulating material 14, which is glass as used in this invention, supports and suitably spaces wires 11, 12 and 13 and also forms an effective seal against the entrance of moisture with the band 10 and its inwardly extending portions. The wires 11, 12 and 13 serve as the emitter, collector, and base electrodes respectively. Base electrode 13 is spaced by the insulating material 14 at the quarter point between the emitter and collector electrodes to allow the transistor to be inserted into a standard transistor socket.

The junction crystal 15 is supported between the emitter electrode 11 and collector electrode 12 above the level of the header. As shown in Figure 1, collector electrode 12 extends vertically upward and emitter electrode 11 is laterally offset in the direction of collector electrode 12. Also, the base connector electrode 13 is bent at 90° from the vertical in the direction of collector electrode 12. This particular arrangement of the electrodes has been found to be advantageous due to the fact that the p-type layer is not always located at the mid-point of the crystal and also because the base electrode is spaced much closer to the emitter electrode than the collector electrode. With the arrangement shown, it is possible for the crystal contact wire 16 to contact the p-type layer and extend vertically downward for connection to the base electrode 13 regardless of the position of the p-type layer along the crystal. It is clear from this description that the crystal is not equal in length to the spacing between the emitter and collector electrodes. It has been found that a crystal of this lesser length has very satisfactory output characteristics and is advantageous in allowing the contact wire 16 to contact the p-type layer and extend vertically downward to the base electrode 13. However, this is not to be construed as a limitation on the invention since satisfactory operation of the transistor can be obtained even though contact wire 16 is out of line vertically due to a different arrangement of the emitter and collector electrodes.

Figure 3:
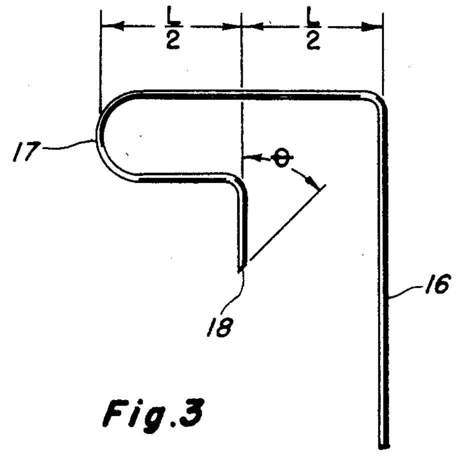
Figure 3 is a view in side elevation showing the shape of the base electrode wire.

The crystal contact wire 16 is formed essentially as a cantilever spring as shown in the detailed Figure 3. The cantilever portion of contact wire 16 is designated by the numeral 17. After the cantilever bend 17 is formed, it can be seen that contact wire 16 terminates in a vertical portion which is located at L/2 between the bend and the straight portion of the contact wire serving as the support. The vertical portion of the contact wire located at the mid-point of the spring section contacts the p-type layer of the crystal and is formed with a very sharp point 18 for this purpose. Point 18 is cut at an angle from the vertical and may vary between 30° and 60°; however, 45° is the preferred value for the angle $\theta$.

Figure 2:
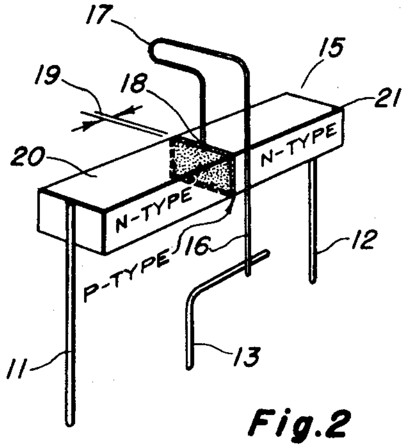
Figure 2 is a schematic representation of the junction type crystal and the electrode connections to the crystal.

After the crystal 15 has been placed between the emitter electrode 11 and the collector electrode 12, it is soldered in place along either side of the electrodes in contact with the end surfaces of the crystal. The step of connecting the contact wire 16 to the crystal is a very crucial step in the formation of junction type transistors and is accomplished by first gripping the wire with a special clip at the L/2 point of the cantilever section. The clip is supported by a jig which moves the clip and the contact wire 16 along the length of crystal 15 until instruments connected to the clip indicate that point 18 is in contact with the p-layer. Contact wire 16 is then welded to the crystal by passing a charge through the clip and thus, wire 16, which melts the crystal in the immediate vicinity of the point. As the crystal melts, the spring section forces point 18 into the p-layer. A .002 inch diameter gold wire alloyed with 1% gallium by weight has the requisite spring action and is sufficiently durable to serve as the crystal contact wire. In the schematic representation of crystal 15 in Figure 2, the p-type layer 19 is shown between the n-type layers 20 and 21. The thickness of layer 19 is carefully grown to a thickness of approximately .001 inch.

Since the diameter of the contact wire 16 is .002 inch and comes in contact with a p-type layer which has a thickness of approximately .001 inch, it can be seen that a portion of the wire may extend into the n-type layers on either side of the p-type layer or into only one of the n-type layers. The purpose of alloying gallium in the gold wire is to form a contact wire rich in p-type material so that the p-type layer will be continuous even though a portion of the gold wire extends into an n-type layer. In this connection, it has been found to be more advantageous for the contact wire to extend into the collector rather than the emitter layer or into both n-type layers.

With point 18 welded to the p-layer 19 of crystal 15, the straight portion of contact wire 16 is soldered at some point 22 along the horizontal portion of base electrode 13. The transistor is then completed by placing cover 23 over the electrode and crystal assembly while in a suitable moisture removing apparatus and the lower edge of cover 23 soldered to the sides of band 10.

Figure 4:
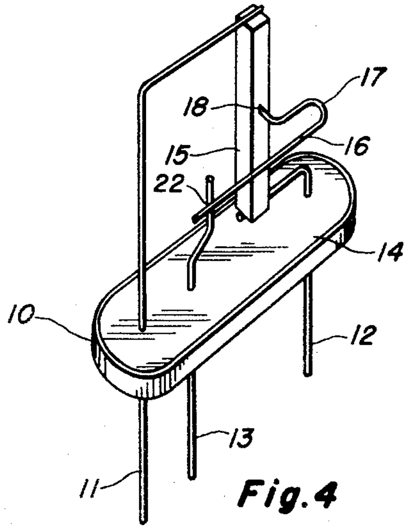
Figure 4 is a view in perspective showing a modification of the invention.

A modification of the invention is shown in Figure 4 in which the crystal 15 is supported vertically between the emitter and collector electrodes. Emitter electrode 11 is bent over at 90° from the vertical to contact the upper surface of crystal 15 while collector electrode is bent at 90° from the vertical to support the lower edge of crystal 15. Base connector electrode is shown offset from the center line of the three electrodes in order to support contact wire 16 in the proper position to allow point 18 to contact p-type layer 19 of crystal 15.

Although the present invention has been shown in specific embodiments, nevertheless, various changes and modifications obvious to one skilled in the art are within the spirit, scope and contemplation of this invention.

What is claimed is:

1. A junction type transistor structure that comprises a collector electrode, an emitter electrode, a base electrode, a header holding said electrodes in proper spaced relationships, a junction type crystal including opposite end portions with an intermediate layer interposed therebetween, said crystal suspended by said collector electrode attached at one end and said emitter electrode attached at the other end, and a crystal contact wire having a straight section fixed to said base electrode, a cantilever spring section and a contact section welded to said intermediate layer of said crystal and urged toward said intermediate layer by said spring section.

2. A junction type transistor as defined in claim 1 wherein said contact section is provided with a point cut at an angle of between 30° and 60° from the axis of said contact section.

3. A junction type transistor as defined in claim 1 wherein said contact section is provided with a point cut at an angle of 45° from the axis of said contact section.

4. A junction type transistor as defined in claim 1 wherein said intermediate layer is approximately .001 inch in thickness and said contact section is approximately .002 inch in diameter and said contact section overlaps, if at all, in the direction of said collector electrode.

5. A junction type transistor as defined in claim 1 wherein said contact section contains a small percentage of the same type of impurity contained in said intermediate layer.

6. A junction type transistor as defined in claim 1 wherein said contact section is composed of gold alloyed with 1% by weight of gallium.

7. A junction type transistor as defined in claim 1 wherein said emitter electrode, said collector electrode, and said contact section lie in a common plane.

8. A junction type transistor as defined in claim 1 wherein said emitter and said collector electrodes lie in a common plane and said contact section is normal to said common plane.

9. A junction type transistor as defined in claim 1 wherein said emitter and said collector electrodes are attached to the ends of said crystal with the axes of said electrodes disposed transversely to the axis of said crystal.

10. A junction type transistor as defined in claim 1 wherein said header includes an insulating material and a metal band surrounding the edge of said material, said metal band extending inwardly underneath said insulating material to form a shelf for same.

11. A junction type transistor as defined in claim 1 wherein a cover encases the operative components of said transistor and is fixed to the sides of said header.

12. A junction type transistor structure that comprises a collector electrode, an emitter electrode, a base electrode, a header holding said electrodes in proper spaced relationship, a junction type crystal including opposite end portions with an intermediate layer interposed therebetween, said crystal suspended by said collector electrode attached at one end and said emitter electrode attached at the other end, a crystal contact wire provided with a first section conductively secured to said base electrode, a second section welded in contact with said intermediate layer of said crystal, and a resilient spring section interposed between said first and second sections to bias said second section toward said intermediate layer during the formation of said contact.

13. A junction type transistor that comprises a base electrode, a collector electrode, an emitter electrode, a header to hold said electrodes in proper spaced relationship, a crystal characterized by end portions of one conductivity type having an intermediate layer of the opposite conductivity type integrally disposed therebetween, said crystal suspended by said collector electrode attached at one end and said emitter attached at the other end, a crystal contact wire which comprises a first section fixed to said base electrode, a second section integrally connected to said intermediate layer, and a resilient biasing section interposed between said first and second sections to urge said second section toward said intermediate layer during the formation of said connection.

14. A junction type transistor which comprises a plurality of electrodes, a crystal conductively connected to at least two of said electrodes, a crystal contact wire having a first section connected to another one of said electrodes, a second section connected to contact a portion of said transistor crystal, and at least one resilient arcuate section interposed between said first and second sections to bias said second section toward said junction type transistor crystal during the formation of said connection.

15. In a junction type transistor structure that includes an n-p-n type crystal, the improvement comprising a crystal contact wire provided with a section having its tip fused in contact with the p-layer of said crystal to terminate in a junction therewith, another section rigidly affixed in spaced relationship with said section terminating in said junction, and a resilient spring section interposed between said section terminating in said junction and said rigidly affixed section to urge said tip into said p-layer during the formation of said junction therewith.

16. The method of connecting the tip of a crystal contact wire to the p-surface of an n-p-n type crystal which comprises, positioning said tip of said wire to contact said crystal, resiliently biasing said tip toward said crystal, moving said contact wire along said crystal surface to contact said p-layer thereof, passing a charge of electric current through said tip of said contact wire and said p-layer to weld same, whereby said resiliently biased tip is forced into said p-layer during said welding.

17. The method of connecting the tip of a crystal contact wire to a surface of crystal to form a junction type transistor which includes positioning said wire adjacent said crystal, providing an elastic deflection to said wire to urge the tip thereof into engagement with said crystal to effectively contact said surface thereof, passing electric current through said junction between said tip and said crystal surface to effectively fuse said tip to said surface of said crystal, whereby said tip effectively fuses with and penetrates said crystal during said passage of electrical current therethrough.

18. The method of connecting the tip of a crystal contact wire to the intermediate layer of a junction type transistor crystal which includes positioning said wire adjacent said crystal, providing an elastic deflection to said wire to urge the tip thereof into engagement with said crystal to effectively contact a surface thereof, moving said contact wire along said crystal surface to contact said intermediate layer thereof, passing electric current through the junction between said tip of said contact wire and said intermediate layer to effectively fuse said tip to said intermediate layer, whereby said tip effectively fuses with and penetrates said intermediate layer during said passage of electrical current therethrough.

19. The method of connecting a crystal contact wire between the intermediate layer of a junction type transistor crystal and an electrode which includes positioning one end of said contact wire adjacent said crystal, providing an elastic deflection to said wire to urge said one end thereof into engagement with said crystal to effectively contact a surface thereof, moving said contact wire along said crystal surface to contact said intermediate layer thereof, passing electric current through the junction between said one end of said contact wire and said intermediate layer to effectively fuse said one end to said intermediate layer, whereby said one end effectively fuses with and penetrates said intermediate layer during said passage of electrical current therethrough, and connecting the other end of said contact wire to said electrode.

References Cited in the file of this patent

UNITED STATES PATENTS

| | | |
|---|---|---|
| 2,438,893 | Bieling | Apr. 6, 1948 |
| 2,538,593 | Rose | Jan. 16, 1951 |
| 2,623,102 | Shockley | Dec. 23, 1952 |
| 2,657,360 | Wallace | Oct. 27, 1953 |
| 2,664,528 | Stelmak | Dec. 29, 1953 |
| 2,671,156 | Douglas et al. | Mar. 2, 1954 |
| 2,705,768 | Kleimack et al. | Apr. 5, 1955 |
| 2,748,235 | Wallace | May 24, 1956 |